(12) United States Patent
Gulick

(10) Patent No.: US 6,473,663 B2
(45) Date of Patent: Oct. 29, 2002

(54) NOISE ELIMINATION IN A USB CODEC

(75) Inventor: Dale A. Gulick, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 63 days.

(21) Appl. No.: 09/772,423

(22) Filed: Jan. 29, 2001

(65) Prior Publication Data

US 2001/0003166 A1 Jun. 7, 2001

Related U.S. Application Data

(62) Division of application No. 08/740,017, filed on Oct. 23, 1996.

(51) Int. Cl.[7] .................................................. G06F 17/00
(52) U.S. Cl. ................................................ 700/94; 381/94.5
(58) Field of Search .......................... 381/94, 94.5, 110, 381/120, 104, 106, 107; 700/94; 713/300

(56) References Cited

U.S. PATENT DOCUMENTS

| 3,860,921 A | 1/1975 | Wood |
| 4,344,175 A | 8/1982 | Leslie |
| 5,532,556 A | 7/1996 | Anderson et al. |
| 5,539,871 A | 7/1996 | Gibson |
| 5,553,220 A | 9/1996 | Keene |
| 5,560,022 A | 9/1996 | Dunstan et al. |
| 5,563,952 A | 10/1996 | Mercer |
| 5,596,647 A | 1/1997 | Wakai et al. |
| 5,615,404 A | 3/1997 | Knoll |
| 5,652,895 A | 7/1997 | Poisner |
| 5,675,813 A | 10/1997 | Holmdahl |
| 5,684,997 A | 11/1997 | Kau et al. |
| 5,734,729 A | 3/1998 | Tran ............................ 381/94.5 |
| 5,768,601 A | 6/1998 | Tran |
| 5,794,057 A | 8/1998 | Lada ............................ 713/300 |
| 5,818,948 A | 10/1998 | Gulick |
| 6,216,052 B1 * | 4/2001 | Gulick ........................... 700/94 |

FOREIGN PATENT DOCUMENTS

| DE | 29610940 U1 | 9/1996 |
| EP | 0641139 A2 | 6/1994 |
| EP | 0703713 A2 | 3/1996 |
| EP | 0720142 A | 7/1996 |
| WO | 9608108 | 3/1996 |

OTHER PUBLICATIONS

Universal Serial Bus Specification, Compaq, et al., Revision 0.9, Mar. 31, 1995, pp. 1–120.

* cited by examiner

Primary Examiner—Minsun Oh Harvey
(74) Attorney, Agent, or Firm—Conley, Rose & Tayon, PC; Robert C. Kowert

(57) ABSTRACT

A controller for a powered loudspeaker including a bus monitor configured to monitor a bus for activity and a click suppression unit coupled to the bus monitor and configured to control speaker volume by ramping the volume down if an absence of data on the bus is detected, and restoring the volume once bus activity begins again. In this manner, undesired clicks and hisses upon power up and power down are minimized.

19 Claims, 7 Drawing Sheets

NOISE ELIMINATION IN A USB CODEC

CONTINUING DATA

This application is a division of U.S. application Ser. No. 08/740,017, field Oct. 23, 1996.

FIELD OF THE INVENTION

The present invention relates to speakers for personal computers and particularly to an architecture for a Universal Serial Bus-based PC speaker controller having noise elimination circuitry.

DESCRIPTION OF THE RELATED ART

The Universal Serial Bus (USB) specification is a proposed standard recently promulgated by a group of computer companies including Compaq Computer Corporation, Digital Equipment Corporation, IBM, Intel Corporation, Microsoft Corporation and Northern Telecom. Described below are various aspects of the Universal Serial Bus. Further background concerning the Universal Serial Bus may be obtained from the Universal Serial Bus Specification, Revision 1.0, which is hereby incorporated by reference. The Universal Serial Bus is intended as a bidirectional, isochronous, low-cost, dynamically attachable, serial interface to promote easy PC peripheral expansion and provide full support for real-time voice, audio, and compressed video data. The Universal Serial Bus provides two-wire point-to-point signaling in which the signals are differentially driven at a bit rate of 12 megabits per second. The Universal Serial Bus includes support for both isochronous and asynchronous messaging at the 12 megabit per second data speed.

The Universal Serial Bus specification defines a Universal Serial Bus system in terms of Universal Serial Bus "interconnects", "devices", and "hosts". A Universal Serial Bus interconnect defines the manner in which devices are connected to and communicate with the host, including bus topology, data flow models, scheduling, and interlayer relationships. In any given Universal Serial Bus topology, there is only one host.

Universal Serial Bus devices include hubs and functions. Hubs provide additional attachment points to the Universal Serial Bus and may be integrated with a host, which ordinarily provides only one attachment point for connecting a hub or a function. Functions provide capabilities to the system, such as joystick, keyboard, microphone, and speaker capabilities.

The basic data transfer protocol of the Universal Serial Bus is described as follows, with particular attention to FIG. 1. FIG. 1 is a diagram of the basic packet transfer 1000 of the Universal Serial Bus. The basic transfer 1000 includes a token packet 1002, a data packet 1004, and a handshake packet 1006. Each packet is preceded by a synchronization field SYNC which is used by input circuitry to align incoming data with the local clock. It is defined to be 8 bits in length and is stripped out by the connector interface.

Following the SYNC field in each packet is a packet identifier (PID(T) for the token packet, PID(D) for the data packet, PID(H) for the handshake packet, and PID(S) for the start-of-frame packet, which may be considered a type of token packet). The packet identifiers PID(T), PID(D), PID(H) and PID(S) include a 4-bit identification field and a 4-bit check field used to identify the format of the packet and type. There are two types of token 1002 packet ID fields PID(T). These denote (i) a data transfer from the function to the host; and (ii) a data transfer from the host to the function. In addition to the packet ID, PID(T), the token packet includes an 8-bit address field ADDR and a 3-bit end point field, ENDP. The address field ADDR of the token packet specifies the function that it is to receive or send the data packet. The end-point field ENDP permits addressing of more than one subchannel of an individual function.

Only one type of start-of-frame packet identification field 1008, PID(S), is defined: a start of frame time stamp. The address and endpoint fields of the token packet are replaced in the start of frame packet with a time-stamp field. The time-stamp field for the start of frame packet provides a clock tick which is available to all devices on the bus. The start-of-frame packet is sent by the host every 1 ms±0.01%. In addition, for both the token and start-of-frame packets, a 5-bit cyclical redundancy checksum (CRC) field is provided.

The data packet 1004 includes a packet identifier PID(D), a data field DATA, and a 16-bit cyclical redundancy checksum field, CRC16. Two types of packet IDs for the data field, data 0 and data 1, identify whether the data packet is being sent for the first time or whether being sent as a retry. The data field DATA may vary in length from 0 to N bytes. Failure of the cyclical redundancy checksum on the data field DATA causes the receiver to issue an error ERR handshake.

The handshake packet 1006 includes only a packet identifier PID(H), of which there are four types. An acknowledge handshake, ACK, indicates that the receiver will accept the data and that the CRC has succeeded. A negative acknowledge, NACK, indicates that the receiver cannot accept the data or that the source cannot send the data. An ERR field indicates that the receiver will accept the data, but that the CRC has failed. A stall handshake packet, STALL, indicates that the transmission or reception pipe is stalled. A stall handshake is defined only for stream-oriented endpoints (as distinguished from message-oriented endpoints, discussed below).

Data flow on the Universal Serial Bus is defined in terms of "pipes." A pipe is a connection between a host and an endpoint. The Universal Serial Bus defines "stream" and "message" pipes. For a stream pipe, data is delivered in prenegotiated packet sizes. Data flows in at one end of the stream pipe and out the other end in the same order. Stream mode thus includes flow control and employs no defined USB structure. For a message pipe, however, a request is first sent to the device which is followed at some later time by a response from the end-point. Message pipes thus impose a structure on the data flow, which allows commands to be communicated. These commands can include bandwidth allocation.

The Universal Serial Bus supports isochronous, asynchronous, and asynchronous interactive data flow. For isochronous data, access to USB bandwidth is guaranteed. A constant data rate through the pipe is provided, and in the case of delivery failure due to error, there is no attempt to retry to deliver the data. Asynchronous interactive data flow provides a guaranteed service rate for the pipe, and the retry of failed transfer attempts. Asynchronous data flow accommodates access to the USB on a band-width available basis and also permits retry of data transfers.

Scheduling of the Universal Serial Bus is defined in terms of "slots", "frames" and "super frames", as illustrated in FIG. 2, which shows an exemplary USB schedule 1100. Frames 1104a and 1104b begin with a start of frame packet, 1108a and 1108b, respectively. Each frame has a duration of time equal to 1±N ms. Each frame, 1104b, 1104b is subdivided into one or more slots, 1102a, 1102b, for example. Each slot corresponds to some USB transaction, e.g., 1110a, 1110b, 1110c, 1110d. Each slot is large enough to contain the worst case transmission time of the transaction to which it corresponds, and includes the effects of bit-stuffing, propagation delay through cables and hubs, response delays, and clocking differences between the host and the end-point. A super frame 1106 consists of a repeatable sequence of individual frames, and is the largest schedulable portion of time permitted.

The Universal Serial Bus provides both periodic service and aperiodic service. For periodic service corresponding to isochronous data, a fixed period exists between the delivery of start of frame packets to a specific end-point. However, aperiodic service is characterized by a varying period between delivery of start of frame tokens for a given end-point. Periodic service is given a higher priority in scheduling than aperiodic service.

Turning now to FIG. 3, there is illustrated an abstracted block diagram of a Universal Serial Bus device, such as a hub or function. Universal Serial Bus device 1200 includes a device interface 1202 and a class interface 1204. Device interface 1202 includes device information and control block 1206, which is required for the USB device to attach to the USB and is independent of the functionality provided by the device. The device interface further includes serial bus interface engine 1210, which provide for management of the bus interface, including performing acknowledgments and recognizing packets that are addressed to the USB device. In addition, the interface engine 1210 provides for stripping the SYNC field from incoming packets. The class interface 1204 includes class information and control block 1214 which depends upon the functionality of the device (for example, hubs and locators). Class interface 1204 further includes function engine 1216 which relates to the functionality implemented by the device. A USB device further includes logical buffers, such as packet buffer 1208 and elasticity buffer 1212. The packet buffer defines the maximum packet size which the USB device can receive or send. The elasticity buffer relates to how flexible the scheduled generator may be in allocating band-width for the associated end-point and determines the maximum amount of data the device end-point can handle. The various functional blocks of the USB device are not shown connected to one another in FIG. 3 because, as discussed in the USB specification, the relationship among the components may be implementation-dependent. In addition, a Universal Serial Bus device may include storage space, local to the USB device, though addressable by the host; and vendor space, which may be defined by the vendor of the device.

While the Universal Serial Bus is intended to be an industry-wide standard peripheral interface, the Universal Serial Bus Specification does not define the relationship among components in Universal Serial Bus devices. There is therefore a need to provide novel architectures for Universal Serial Bus devices. More particularly, there is a need to define a novel architecture for a powered speaker and/or microphone compatible with the Universal Serial Bus Specification.

In addition, while the USB specification defines signaling whereby a USB device or hub controller may wake the network from a low power mode, the USB specification does not define a mechanism whereby the devices may power themselves down or awaken in response to the signaling. There is therefore a need to provide a USB compatible speaker and/or microphone having power management capabilities.

Moreover, in the case of a USB speaker and/or microphone, random power fluctuations, either at power-up or during normal operation, can feed through the speakers and cause annoying "pops" and "hisses" to be transmitted through the speakers. In the extreme case, these can cause damage to the speaker. Accordingly, there is a need to provide a USB compatible speaker and/or microphone having click suppression when the USB is unstable or during power-up and power-down.

SUMMARY OF THE INVENTION

Accordingly, there is provided a novel powered loudspeaker implemented to be compatible with a serial bus standard and, particularly, the Universal Serial Bus specification. The powered speaker includes a speaker driven by a power amplifier coupled to a power supply. Both the amplifier and the power supply, in turn, are coupled to a Universal Serial Bus controller. The controller is configured to provide Universal Serial Bus functionality and compatibility. In addition, a phase locked loop (PLL) for recovering a timer clock from the received data stream is provided. One embodiment of the present system further includes a function whereby the absence of data on the relevant channel is detected and the output to the speakers is muted in response thereto. A further circuit is provided that controls when the output to the speaker is turned on such that no clicks or pops occur at power-up or when the device or bus is not stable. In addition, tone control, including bass and treble filters, volume control, and balance between left and right outputs (in a stereo version) are provided. Furthermore, power management functionality is provided. If the USB has been idle for a predetermined period of time, the system can place itself into a low power sleep mode, or the loudspeaker can be placed into a sleep mode via software from the host.

A microphone compatible with the Universal Serial Bus specification may also be provided, either as a discrete unit or integrated with the loudspeaker. The microphone includes a microphone input driving an amplifier coupled to a power feed and gain control. Both are coupled to audio data circuitry, which includes an analog-to-digital converter and various filters, tone and volume control, and a circuit for providing 3D audio effects. Both the gain control and the audio data block are coupled to a Universal Serial Bus controller. The controller is configured to provide Universal Serial Bus functionality and compatibility. In addition, a circuit for integrating the microphone signal into an isochronous USB signal is provided.

A power control circuit for use with a USB microphone/speaker includes a mechanism for monitoring activity on the Universal Serial Bus. If the USB has been idle for a predetermined period, the control mechanism will power down the speaker. For example, the circuit may be configured to monitor activity levels on a particular channel of the USB. If the activity levels are below a predetermined threshold for a predetermined period, the control circuit will cause the power to the device to shut off or down. In this power down state, however, the circuit will monitor the bus for host signals indicating that the speaker is to be powered up once more. In the case of the microphone, the circuit will also monitor the audio input and cause the microphone to power up in response to receiving an input signal. Circuitry is also provided for the microphone to awaken the rest of the system. Circuitry may also be provided to monitor the level and duration of the input signal. Thus, the microphone will not power up unless the input exceeds a predetermined activity and duration threshold. In this way, the microphone will not waken the network to process transient undesired inputs.

As noted above, one problem with controlling power to loudspeakers is that of voltage transients causing hisses or clicks. Accordingly, there is provided a mechanism to monitor the DC voltage level and turn off the power if it goes below a predetermined threshold. The volume is ramped to zero after which power may be turned off. After a predetermined time, allowing the transient to subside, the volume may be ramped back to the original level. In addition to monitoring the DC voltage level, the circuit will monitor the cyclical redundancy checksum for failure and look for random noise signals. Either can be a source of clicks or hisses. Once either is detected, the circuit will ramp the volume down; after a predetermined time, volume will be ramped back to the original level. In another embodiment, the monitoring circuit will continue monitoring while the volume is down and, when the error condition is no longer detected, restore the volume to its original level. In addition, high pass filtering may be provided to reject low frequency noise.

BRIEF DESCRIPTION OF THE DRAWINGS

A better understanding of the present invention can be obtained when the following detailed description of the preferred embodiment is considered in conjunction with the following drawings, in which.

Figure 1:
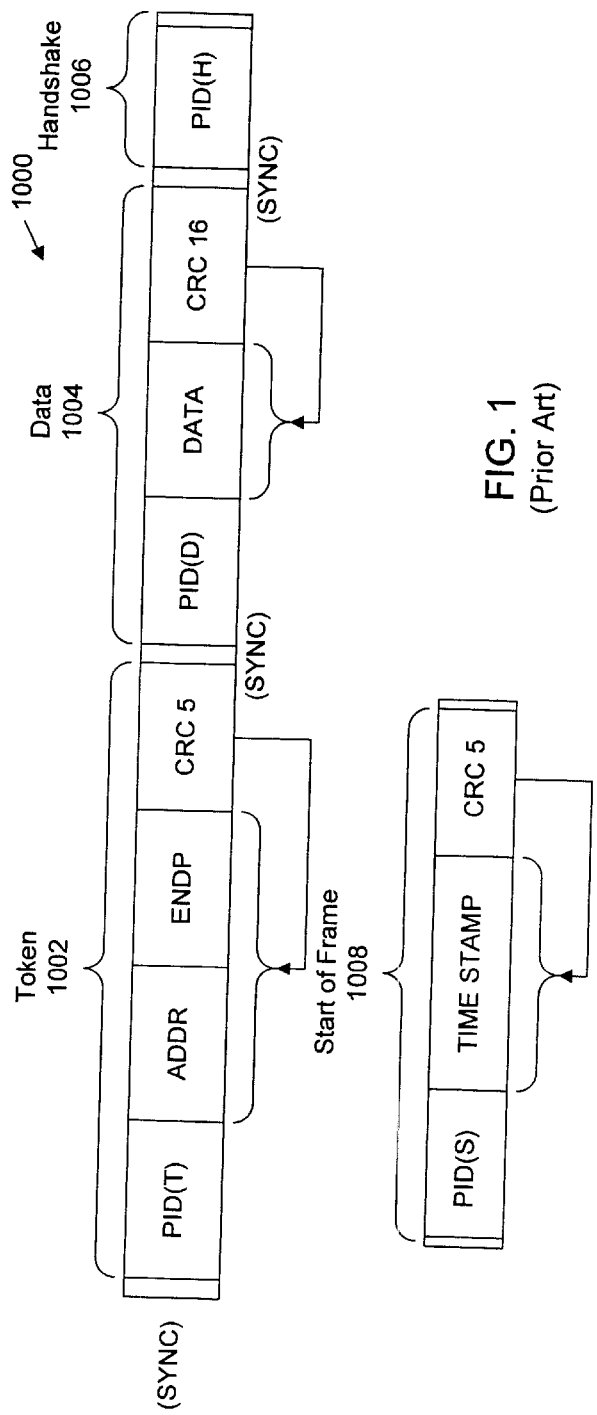
FIG. 1 is a representation of a data packet transfer along with a Universal Serial Bus.
Figure 2:
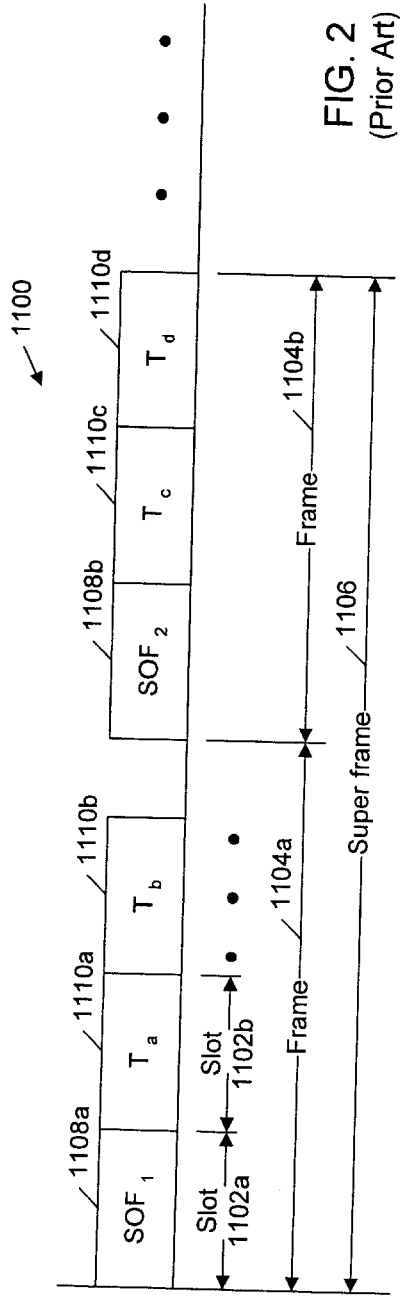
FIG. 2 is a representation of a scheduling paradigm for the Universal Serial Bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
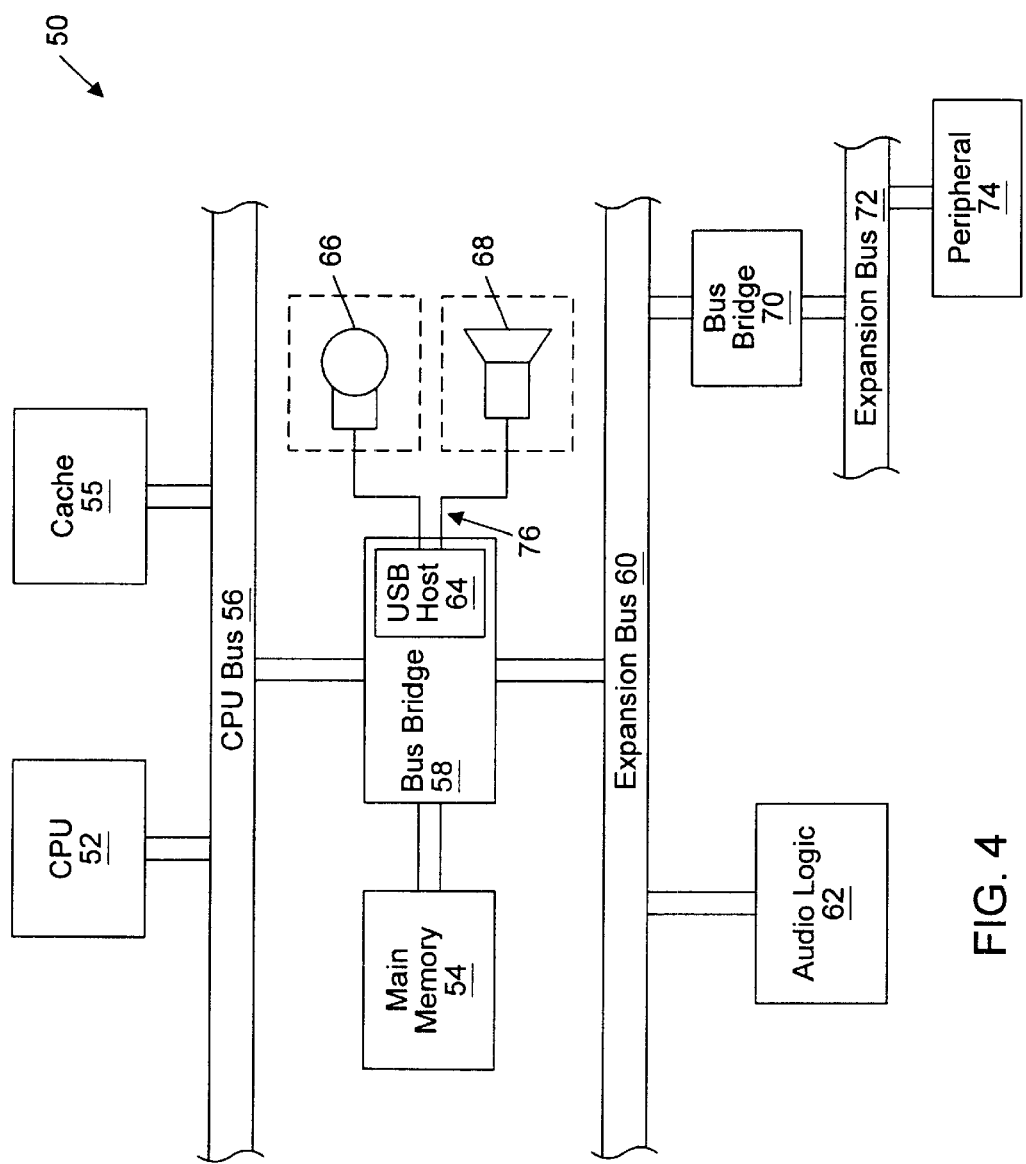
FIG. 4 is a block diagram of a computer system with audio functionality according to one aspect of the claimed invention.

Turning now to the drawings, and with particular attention to FIG. 4, a computer system 50 is shown according to one embodiment of the present invention. Computer system 50 includes a CPU 52 and a cache memory 55 coupled to a CPU bus 56. CPU 52 may be any of a variety of microprocessors, including processors compatible with the x86, PowerPC, and 68000 series instruction sets. CPU bus 56 is coupled to bus bridge 58, which provides an interface to expansion bus 60. Also coupled to bus bridge 58 is a main memory 54. Bus bridge 58 may include a variety of system support logic including cache and memory controls, as well as providing host/expansion bridge functionality. In addition, bus bridge 58 may include a serial bus host interface 64, preferably a Universal Serial Bus host interface, which provides connectivity to microphone 66 and speaker 68 via a serial bus or Universal Serial Bus 76. Thus, for example, audio data from microphone 66 is transmitted to USB host 64 via USB 76. From there, it is transferred to main memory 54, from which it is accessible to audio logic 62. Expansion bus 60 may be any of a variety of types of expansion buses, including buses compatible with the industry standard architecture (ISA), the extended industry standard architecture (EISA), the Microchannel architecture (MCA) or the Peripheral Component Interface (PCI) bus architecture. It is to be noted that the architecture shown in FIG. 4 is exemplary only and that other configurations are envisaged. Expansion bus 60 may further couple one or more additional bus bridges 70, to one or more additional expansion buses 72, to which peripheral device 74 may be coupled.

Figure 5:
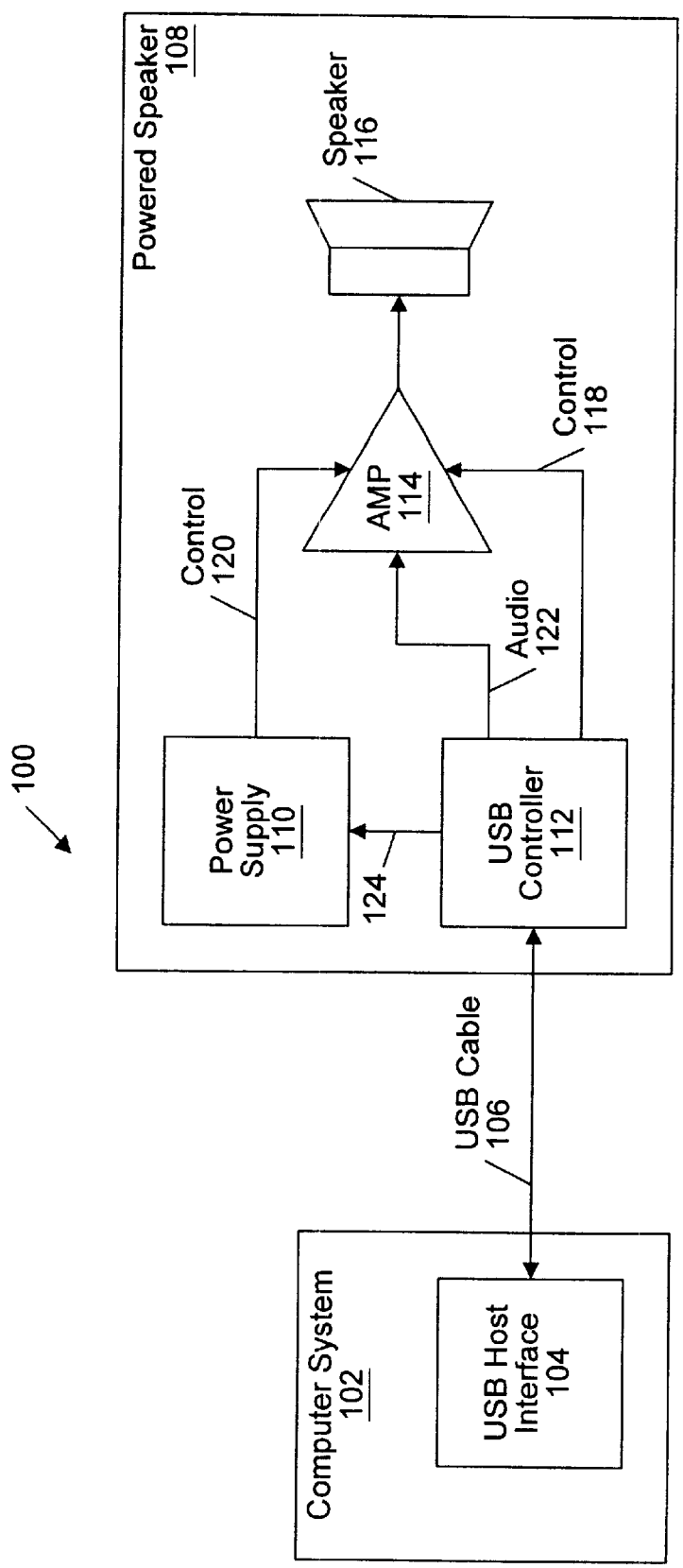
FIG. 5 is a block diagram of a computer speaker system according to one embodiment of the present invention.

Turning now to FIG. 5, a more detailed block diagram of a computer audio system 100 is shown. Computer audio system 100 is exemplary of, for example, the computer system 50 shown in FIG. 4. Computer audio system 100 includes a computer system 102, which includes a Universal Serial Bus host interface 104. Computer system 102 is coupled via a USB cable 106 to powered loudspeaker 108. Powered loudspeaker 108 is coupled to the USB cable 106 at a USB connector (not shown). The USB signals are input to USB controller 112, which provides an audio signal along line 122 to power amplifier 114, which drives speaker 116. USB controller 112 further provides an amplifier control signal along line 118 to amplifier 114, and a power supply control signal along line 124 to power supply 110. Power supply 110 further provides a control along line 120 to amplifier 114. USB Controller 112 is preferably a single integrated circuit.

Figure 3:
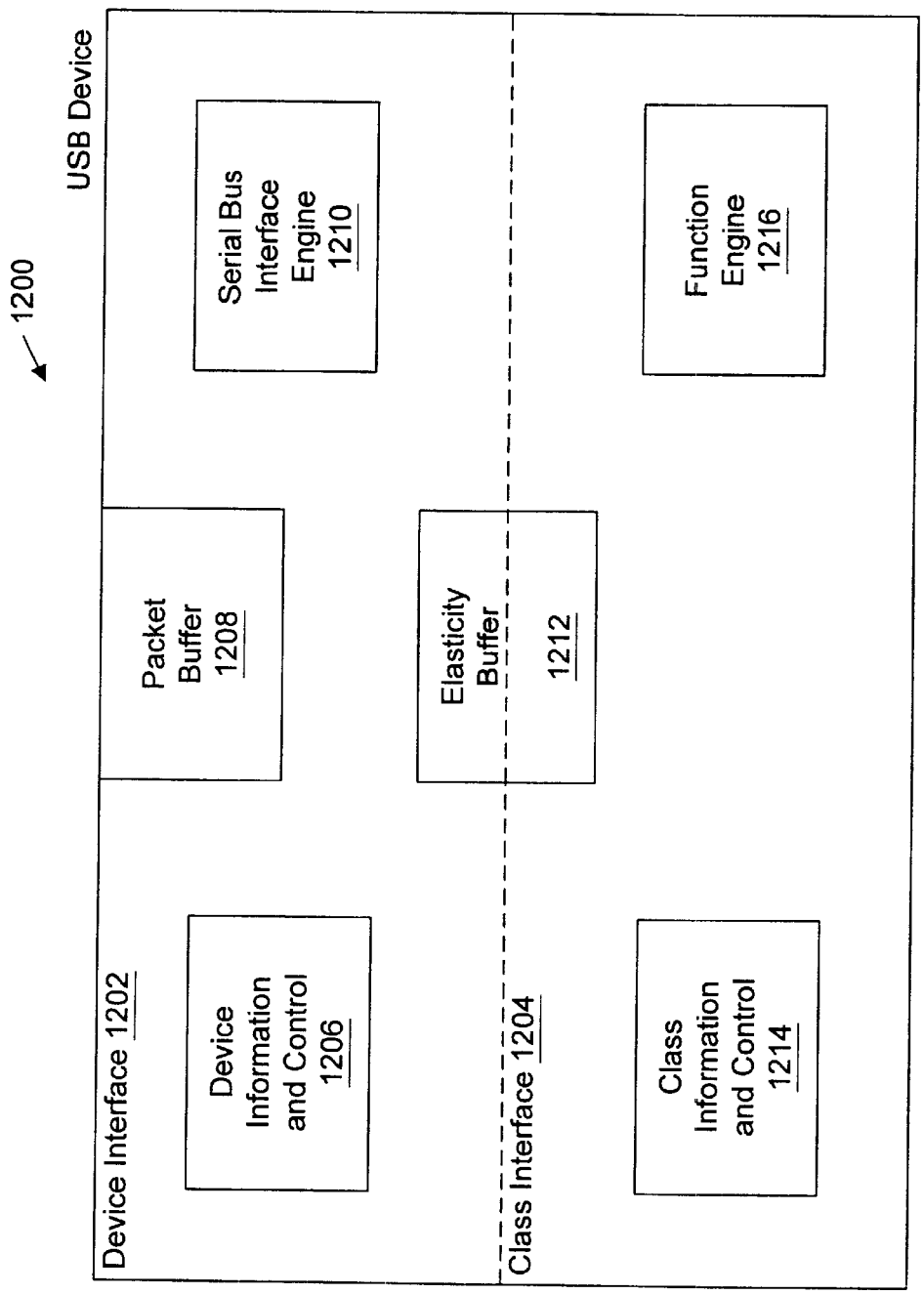
FIG. 3 is a block diagram of an exemplary Universal Serial Bus device.
Figure 6:
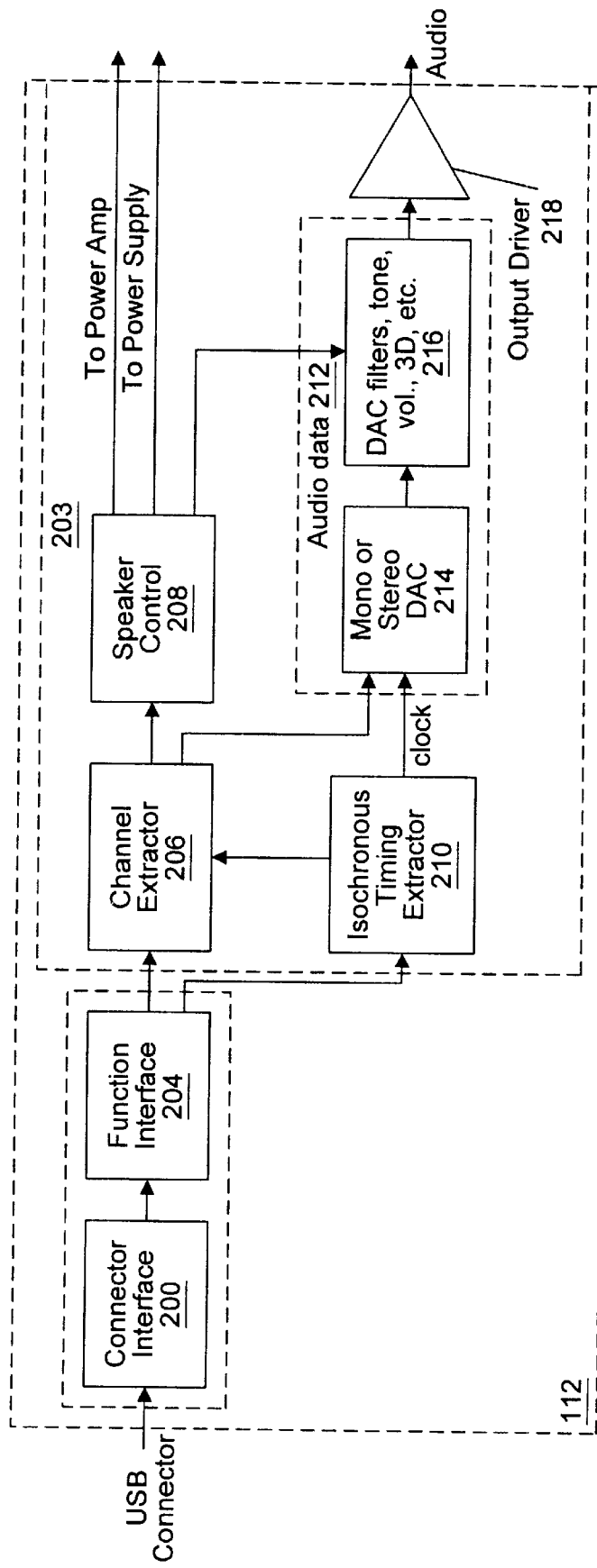
FIG. 6 is a block diagram of a USB controller for a powered loudspeaker according to one embodiment of the present invention.

USB controller 112 is shown in greater detail in FIG. 6. A USB connector (not shown) receives USB cable 106 (FIG. 5). The USB connector provides the USB signal to connector interface 200 and function interface 204. Connector interface 200 provides the physical layer translation between the USB differentially-driven signal levels and internal logic levels. Function interface 204 receives the translated signal from connector interface 200 and provides the control functions required of all Universal Serial Bus functions. Thus, for example, function interface 204 acts as the serial bus interface engine and as device and class information and control blocks discussed with regard to FIG. 3 above. Function interface 204 serves to receive the USB signal, strip off the SYNC field, and provide the signal to the function engine 203.

More particularly, the data will be received at the 1 ms USB frame rate with the packet size value based on the audio data sampling rate. The Universal Serial Bus signal is provided to channel extractor 206 and isochronous timing extractor 210. The received signal is provided in isochronous-mode because the audio signal should be provided in real-time. Isochronous signal timing on the Universal Serial Bus is implied by the steady rate at which the data is received. Thus, for example, data will be received periodically in periodic mode along the bus based on the sampling requirements of audio data. Because timing on the Universal Serial Bus during isochronous mode is implied, the clock must be extracted from the periodic data. Thus, isochronous timing extractor 210 employs a digital phase locked loop to derive internal audio clocks. Isochronous timing extractor 210 provides the clock to audio data block 212, which will be described in greater detail below. Isochronous timing extractor 210 is further coupled to channel extractor 206.

Channel extractor 206 separates the audio subchannel from the other data subchannels on the Universal Serial Bus. As discussed above, each device subchannel on the Universal Serial Bus corresponds to a particular address and endpoint combination. Audio data, for example, corresponds to a particular address and endpoint received. Control data corresponds to another address and endpoint combination. The channel extractor 206 monitors the various unique endpoints and separates them out from one another. As will be discussed in more detail below, this control data can include volume, balance and tone information. It should further be noted that this information may be provided on separate channels. Since one channel on the bus is reserved for bus control, this leaves a capability of up to a total of six speaker control channels. Channel extractor 206 provides the data from the audio control subchannel or subchannels to speaker controller 208 and the audio data from the audio subchannel to audio data block 212.

Audio data block 212 can include a mono or stereo digital-to-analog converter and filter 214 coupled to an analog audio block 216. Analog audio block 216 performs analog filtering, and provides tone, balance, volume adjustment and muting. Controls for these functions may be provided from speaker control 208 or from analog potentiometers directly affixed to the speaker itself. In addition, audio data block 212 can include a 3D audio block which provides stereo enhancement for a multi-dimensional "feel" to the sound. It is noted that in alternative embodiments, the audio data block 212 is a digital audio data block.

Speaker control 208 reads the control channel received from channel extractor 206 and provides it to audio data block 212. In particular, the control channel or channels can include volume, balance, and tone information, as well as a variety of filtering. The filtered audio data signal is provided to an output driver 218, and is then provided to amplifier 114 of FIG. 4 and then to speaker 116. It should be noted that while the tone, volume, and balance controls may be provided digitally via the Universal Serial Bus and hence software, in alternate embodiments, such controls may be provided via physical hardware such as analog potentiometers and the like.

Speaker control 208 also monitors the audio channel and detects the absence of data for entering a sleep mode. If such an absence is detected, speaker control 208 will power down the speaker. More generally, speaker control 208 monitors whether or not the Universal Serial Bus is idle. Speaker control 208 may detect, for example, the absence of audio data or clock data. If the bus is idle, the speaker control circuit 208 will turn off the power to the speaker in a gradual, controlled fashion. Power is restored only after the Universal Serial Bus becomes active once again. In this way, power may be conserved when the speaker is not in use. Further, the speaker control circuit provides a control to the audio data circuitry to mute the audio output until the power is restored. In this fashion, hisses due to the absence of data and clicks and noises at power-up can be avoided. More particularly, the system may be configured such that the volume may be gradually ramped to zero in response to any of a member of warning conditions. This can also include turning off the power completely upon ramp-down. These can include the detection of an aberrational DC level; a bad CRC; or other random values. Power may be restored through ramping the volume back to the original level, after a predetermined time, or after the warning condition no longer exists. Additional functionality may be provided wherein the powered speaker can be placed into a powered-down mode through a software command from the PC. The powered loudspeaker may be powered up after a predetermined time, or by command from the host PC. Furthermore, high pass filtering, preferably at about 20 Hz, may be provided for rejection of low frequency "hiss" and "pop" components introduced due to too low a DC level.

Figure 7:
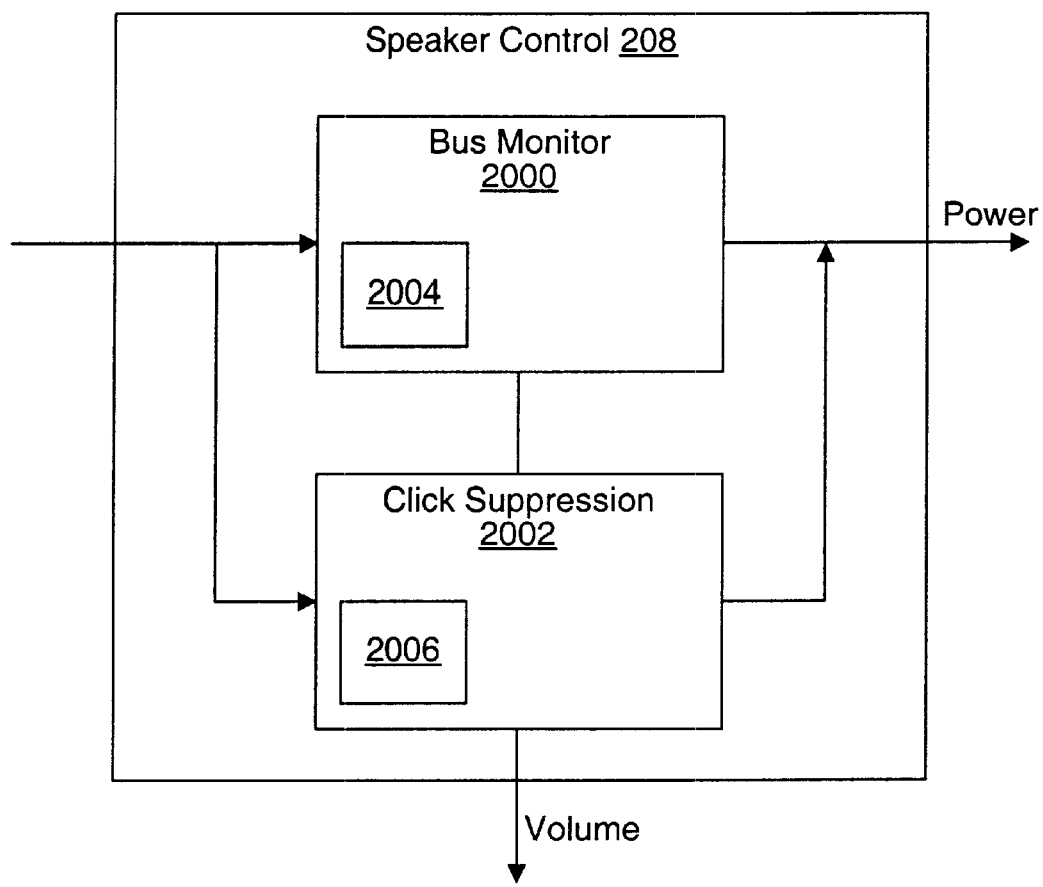
FIG. 7 is a more detailed block diagram of a speaker control according to one aspect of the present invention.

Turning now to FIG. 7, a more detailed block diagram of speaker control 208 is shown. Speaker control 208 includes a bus monitor 2000 and a click suppression or power management unit 2002. Both bus monitor 2000 and click suppression or power management unit 2002 are coupled to the power supply (not shown) and are coupled to receive the USB input signal from the channel extractor (not shown). Bus monitor 2000 and click suppression unit 2002 are further coupled to one another.

Bus monitor 2000 is configured to monitor the USB input signal. For example, it may monitor the audio data signal or the clock signal. When the bus monitor detects that the USB is idle, it will transmit a signal to the power supply, causing the power to shut off. A counter 2004 may be provided, which will count to a predetermined value upon detection of the absence of data on the bus. When the value is reached, if there is still no data on the bus, the power may be shut off. Prior to sending the power off control signal to the power supply, bus monitor 2000 may also send a control signal to click suppression unit 2002, causing the click suppression unit 2002 to ramp the volume down to zero before shutting off the power.

Bus monitor 2000 will continue to monitor the USB during the power down mode. If the bus monitor 2000 detects activity on the bus, the monitor will cause the power supply to restore power. Once power is turned back on, the bus monitor 2000 may send a control signal to the click suppression unit to cause it to ramp the volume back up.

In addition to responding to the power-on/power-off modes controlled by the bus monitor 2000, click suppression unit 2002 will also monitor the audio input for the presence of error conditions. These can include monitoring for too low a DC level, monitoring for a failed CRC, and monitoring for random noise. In addition, high pass filtering may be provided to reject the low frequency noise components. If any of these conditions are detected, the click suppression unit will cause the volume to ramp down to zero. Click suppression unit 2002 may continue to monitor the input and, when the error condition has cleared, restore the volume in a gradual ramp, so as to avoid clicks, etc. The click suppression unit 2002 may also be coupled to turn off the power if the error condition persists. Once the error condition has been cleared, click suppression unit may restore power, and cause the volume to ramp back to its original level. In a still further embodiment, click suppression unit 2002 can include a counter 2006 which will begin counting when an error condition has been detected and volume ramping has begun. After a preset count, the click suppression unit may be configured to ramp the volume back up, rather than monitoring during the ramping condition. It is to be noted that while the click suppression unit 2002 and the bus monitor 2000 are shown as discrete units, they may be part of an integrated power/volume control unit. Thus, FIG. 7 is exemplary only.

Figure 8:
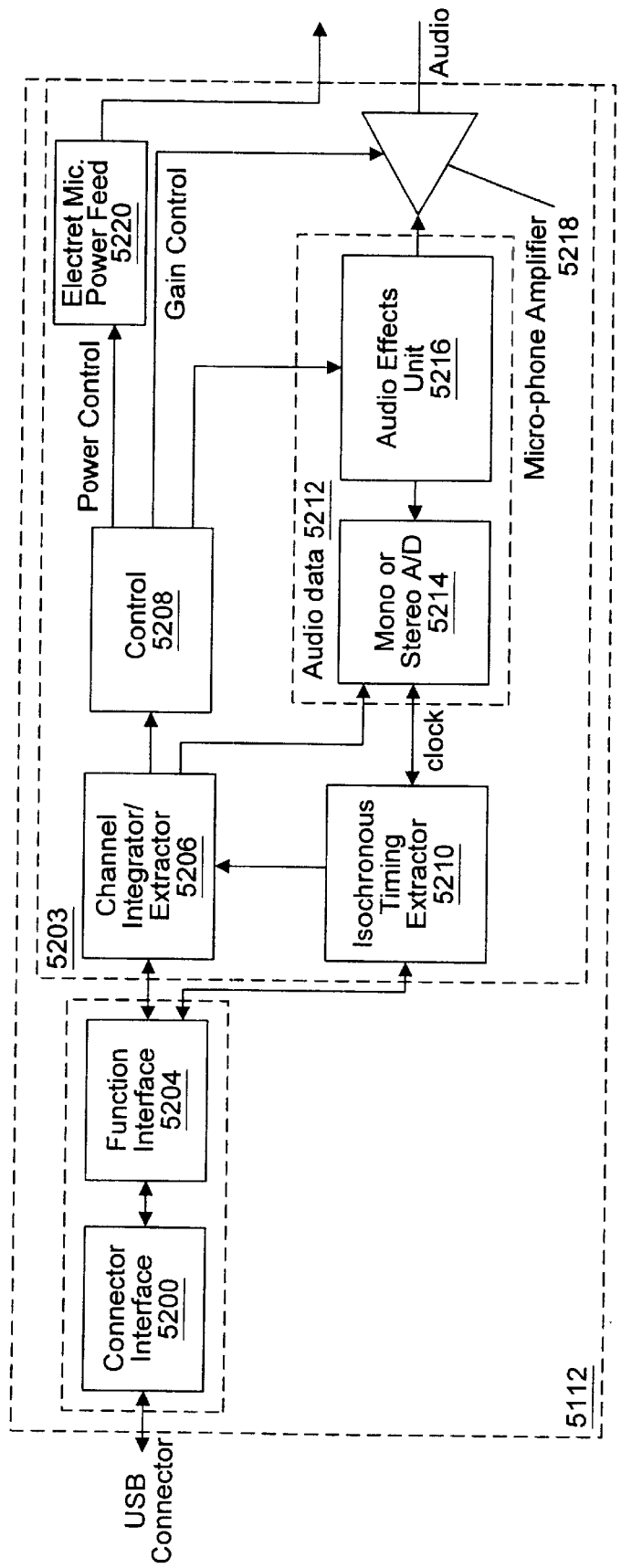
FIG. 8 is a block diagram of a USB controller for a microphone according to one embodiment of the present invention.

Turning now to FIG. 8, there is shown a block diagram of a Universal Serial Bus-based microphone 5112. An audio signal is provided from an external microphone (not shown) to microphone amplifier 5218 and power feed 5220. Power feed 5220 in turn is coupled to receive a control signal from control unit 5208. Control unit 5208 is further coupled to amplifier 5218 and audio data unit 5212. Control unit 5208 is configured to provide power management functions. Thus, control unit 5208 is configured to monitor the clock, the audio input and the USB for activity. Control unit 5208 is configured to turn off power to the microphone on command from the host, or upon detection of a lack of bus or clock activity. It is noted that various of these features may be initialized as desired by software command. In addition, the microphone 5112 may be operative in a low power mode such that the USB link may be powered down while the control unit 5208 monitors the audio input for activity. If input activity is detected, the control unit will "wake up" the USB link.

In addition, in a manner similar to that described above for the speaker, gain control 5208 serves to provide control signals to audio effects unit 5216. Audio effects unit 5216 provides analog filtering, volume and pan control, among other things. Audio effects unit 5216 is further coupled to analog-to-digital converter 5214. It is noted that in alternate embodiments, various components such as the audio effects unit may be implemented with either analog or digital circuitry.

Numerous variations and modifications will become apparent to those skilled in the art once the above disclosure is fully appreciated. It is intended that the following claims be interpreted to embrace all such variations and modifications.

What is claimed is:

1. A computer system, comprising:
   a central processing unit (CPU) coupled to a CPU bus;
   a bus bridge coupling said CPU bus to a serial bus;
   a powered loudspeaker coupled to said serial bus, said powered loudspeaker comprising:
      a bus monitor configured to monitor audio data on said serial bus and to provide a control signal in response to detecting the presence of data errors in the audio data, wherein the control signal indicates the presence of data errors in the audio data; and
      a suppression unit coupled to said bus monitor to receive said control signal and configured to control volume of the powered loudspeaker, wherein said suppression unit is responsive to said control signal to lower said volume according to the presence of data errors.

2. The computer system as recited in claim 1, wherein said data errors comprise a failed cyclic redundancy checksum (CRC).

3. The computer system as recited in claim 1, wherein said bus monitor is further configured to monitor said serial bus for an absence of a predetermined activity on said serial bus and indicate the absence on said control signal, wherein said suppression unit is responsive to said control signal to lower said volume according to the absence of said predetermined activity on said serial bus.

4. The computer system as recited in claim 3, wherein said predetermined activity is clock activity or audio data.

5. The computer system as recited in claim 3, wherein said suppression unit is configured to gradually ramp said volume from a first predetermined level to a second predetermined level responsive to said control signal.

6. The computer system as recited in claim 5, wherein said suppression unit is configured to turn off power to said powered loudspeaker after said volume has been adjusted to said second predetermined level.

7. The computer system as recited claim 6, wherein said suppression unit is configured to restore power to said powered loudspeaker a predetermined time after said power has been turned off.

8. The computer system as recited in claim 7, wherein said suppression unit is configured to ramp said volume from said second predetermined level to said first predetermined level after said power has been restored to said powered loudspeaker.

9. The computer system as recited in claim 6, wherein said suppression unit is configured to restore power to said powered loudspeaker upon said bus monitor detecting the presence of a second predetermined activity.

10. The computer system as recited in claim 9, wherein said suppression unit is configured to ramp said volume from said second predetermined level to said first predetermined level after said power has been restored to said powered loudspeaker.

11. The computer system as recited in claim 1, further including a high pass filter coupled to said bus monitor and configured to remove DC components from an output signal to an amplifier for said powered loudspeaker.

12. The computer system as recited in claim 1, wherein said serial bus comprises a Universal Serial Bus (USB).

13. A computer system, comprising:
    a central processing unit (CPU) coupled to a CPU bus;
    a bus bridge coupling said CPU bus to a serial bus;
    a powered loudspeaker coupled to said serial bus, said powered loudspeaker comprising:
       a bus monitor configured to monitor said bus and to indicate on a control signal a condition selected from the group consisting of a failed cyclic redundancy checksum (CRC) of signals on said bus, random noise audio data, and an aberrational DC voltage level; and
       a suppression unit coupled to said bus monitor to receive said control signal and configured to control volume of a powered loudspeaker coupled to said bus, wherein said suppression unit is responsive to said control signal to lower said volume according to said condition.

14. The computer system as recited in claim 13, wherein said bus comprises a Universal Serial Bus (USB).

15. The computer system as recited in claim 13, wherein said bus monitor is further configured to monitor said bus for activity and to provide a control signal indicating detection of bus activity below a predetermined threshold for a predetermined period of time, and wherein said suppression unit is configured to lower said volume in response to said control signal indicating detection of bus activity below a predetermined threshold for a predetermined period of time.

16. The computer system as recited in claim 15, wherein the speaker controller is configured to shut off power to said powered loudspeaker after said volume is lowered in response to bus activity below said predetermined threshold for said predetermined period of time.

17. The computer system as recited in claim 16, wherein said bus monitor is configured to continue to monitor said bus after power to said powered loudspeaker has been shut off due to low bus activity, and wherein power is restored to said powered loudspeaker upon detection of bus activity and said suppression unit raises said volume after power has been restored.

18. A computer system, comprising:
    a central processing unit (CPU) coupled to a CPU bus;

a bus bridge coupling said CPU bus to a serial bus;
a powered loudspeaker coupled to said serial bus, said powered loudspeaker comprising:
   an interface for coupling said bus controller to a bus and providing signals to and from said bus;
   a bus monitor coupled to said interface and configured to monitor said bus for the presence of clock activity, audio data, or errors in audio data; and
   a suppression unit coupled to said bus monitor and configured to control volume of a powered loudspeaker on said bus responsive to an indication from said bus monitor of an absence of said clock activity, said audio data, or a presence of said errors in audio data on said bus, wherein said suppression unit is configured to gradually ramp said volume of said powered loudspeaker from a first predetermined level to a second predetermined level responsive to said indication of an absence of said clock activity, said audio data, or a presence of said errors in audio data on said bus; and wherein said suppression unit is configured to turn off power to said powered loudspeaker after said volume of said powered loudspeaker has been adjusted to said second predetermined level;
   wherein said suppression unit is configured to restore said power to said powered loudspeaker a predetermined time after said power has been turned off or upon said bus monitor detecting the presence of said clock activity, said audio data, or the absence of said errors on said bus;
   said suppression unit is further configured to ramp said volume of said powered loudspeaker from said second predetermined level to said first predetermined level after said power has been restored to said powered loudspeaker.

19. The computer system as recited in claim 18, wherein said bus is a universal serial bus.

\* \* \* \* \*